(12) United States Patent
Hirayama et al.

(10) Patent No.: US 10,224,374 B2
(45) Date of Patent: Mar. 5, 2019

(54) MEMORY DEVICE

(71) Applicant: TOSHIBA MEMORY CORPORATION, Minato-ku, Tokyo (JP)

(72) Inventors: Kana Hirayama, Yokkaichi Mie (JP); Kazuhiko Yamamoto, Yokkaichi Mie (JP); Yusuke Arayashiki, Yokkaichi Mie (JP); Yosuke Murakami, Yokkaichi Mie (JP); Yusuke Kobayashi, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/697,388

(22) Filed: Sep. 6, 2017

(65) Prior Publication Data
US 2018/0261651 A1 Sep. 13, 2018

(30) Foreign Application Priority Data
Mar. 7, 2017 (JP) .................. 2017-043114

(51) Int. Cl.
*H01L 27/24* (2006.01)
*H01L 45/00* (2006.01)
*G11C 13/00* (2006.01)

(52) U.S. Cl.
CPC ........ *H01L 27/249* (2013.01); *G11C 13/0007* (2013.01); *G11C 13/0069* (2013.01); *G11C 13/0097* (2013.01); *H01L 45/08* (2013.01); *H01L 45/1226* (2013.01); *H01L 45/1246* (2013.01); *H01L 45/1253* (2013.01); *H01L 45/146* (2013.01); *G11C 2213/32* (2013.01); *G11C 2213/51* (2013.01);
(Continued)

(58) Field of Classification Search
CPC ............... H01L 27/249; H01L 45/1226; H01L 45/1246; H01L 45/146
See application file for complete search history.

(56) References Cited

U.S. PATENT DOCUMENTS 8,432,720 B2   4/2013   Awaya et al.
8,450,713 B2   5/2013   Awaya et al.
(Continued)

OTHER PUBLICATIONS

B. Govoreanu et al., "Advanced a-VMCO resistive switching memory through inner interface engineering with wide (>$10^2$) on/off window, tunable µA-range switching current and excellent variability", 2016 Symposium on VLSI Tech. Digest of Technical Papers, 978-1-5090-0638-0/16 © 2016 IEEE, pp. 82-83.
(Continued)

*Primary Examiner* — Allison Bernstein
(74) *Attorney, Agent, or Firm* — Foley & Lardner LLP

(57) ABSTRACT

According to one or more embodiments, a memory device includes a first interconnection extending in a first direction, a plurality of second interconnections extending in a second direction intersecting the first direction, and a first resistance change film provided between the first interconnection and the second interconnections. The first resistance change film includes a first conductive layer having a first conductivity, and a second conductive layer provided between the first conductive layer and the plurality of second interconnections and having a second conductivity higher than the first conductivity.

10 Claims, 8 Drawing Sheets

(52) U.S. Cl.
CPC ...... *G11C 2213/52* (2013.01); *G11C 2213/71* (2013.01); *H01L 27/2436* (2013.01)

(56) References Cited

U.S. PATENT DOCUMENTS

| | | | |
|---|---|---|---|
| 9,252,358 B2 * | 2/2016 | Kanno | H01L 45/04 |
| 9,312,307 B2 * | 4/2016 | Bateman | H01L 27/2454 |
| 9,768,180 B1 * | 9/2017 | Zhou | H01L 27/115 |

OTHER PUBLICATIONS

B. Govoreanu et al., "Vacancy-Modulated Conductive Oxide Resistive RAM (VMCO-RRAM): An Area-Scalable Switching Current, Self-Compliant, Highly Nonlinear and Wide On/Off-Window Resistive Switching Cell", IEDM13-258, 978-1-4799-2306-9/13 © 2013 IEEE, pp. 10.2.1-10.2.4.

* cited by examiner

MEMORY DEVICE

CROSS-REFERENCE TO RELATED APPLICATION

This application claims the benefit of and priority to Japanese Patent Application No. 2017-043114, filed Mar. 7, 2017, the entire contents of which are incorporated herein by reference.

FIELD

Embodiments described herein relate generally to a memory device.

BACKGROUND

Some memory devices are configured such that a resistance change film is connected between two types of interconnects (or interconnections) that extend in directions orthogonal to each other. It is thereby possible to three-dimensionally integrate two-terminal type memory cells and achieve a large capacity. It can be advantageous in a memory device of this type to drive each memory cell highly accurately and independently.

DETAILED DESCRIPTION

One or more embodiments provide for a memory device capable of highly accurately and independently driving memory cells.

In one or more embodiments, according to one aspect, a memory device includes a first interconnection extending in a first direction, a plurality of second interconnections extending in a second direction intersecting the first direction, and a first resistance change film provided between the first interconnection and the plurality of second interconnections. The first resistance change film includes a first conductive layer having a first conductivity, and a second conductive layer provided between the first conductive layer and the plurality of second interconnections and having a second conductivity higher than the first conductivity.

In one or more embodiments, according to another aspect, a memory device includes a first interconnect extending in a first direction, a plurality of second interconnects extending in a second direction intersecting the first direction, and a first resistance change film provided between the first interconnect and the second interconnects. The first resistance change film includes a first conductive layer having a first conductivity, and a plurality of second conductive layers provided between the first conductive layer and the respective plurality of second interconnects, isolated from one another, and having a second conductivity higher than the first conductivity.

(First Aspect)

One or more embodiments according to a first aspect are described below.

Figure 1:
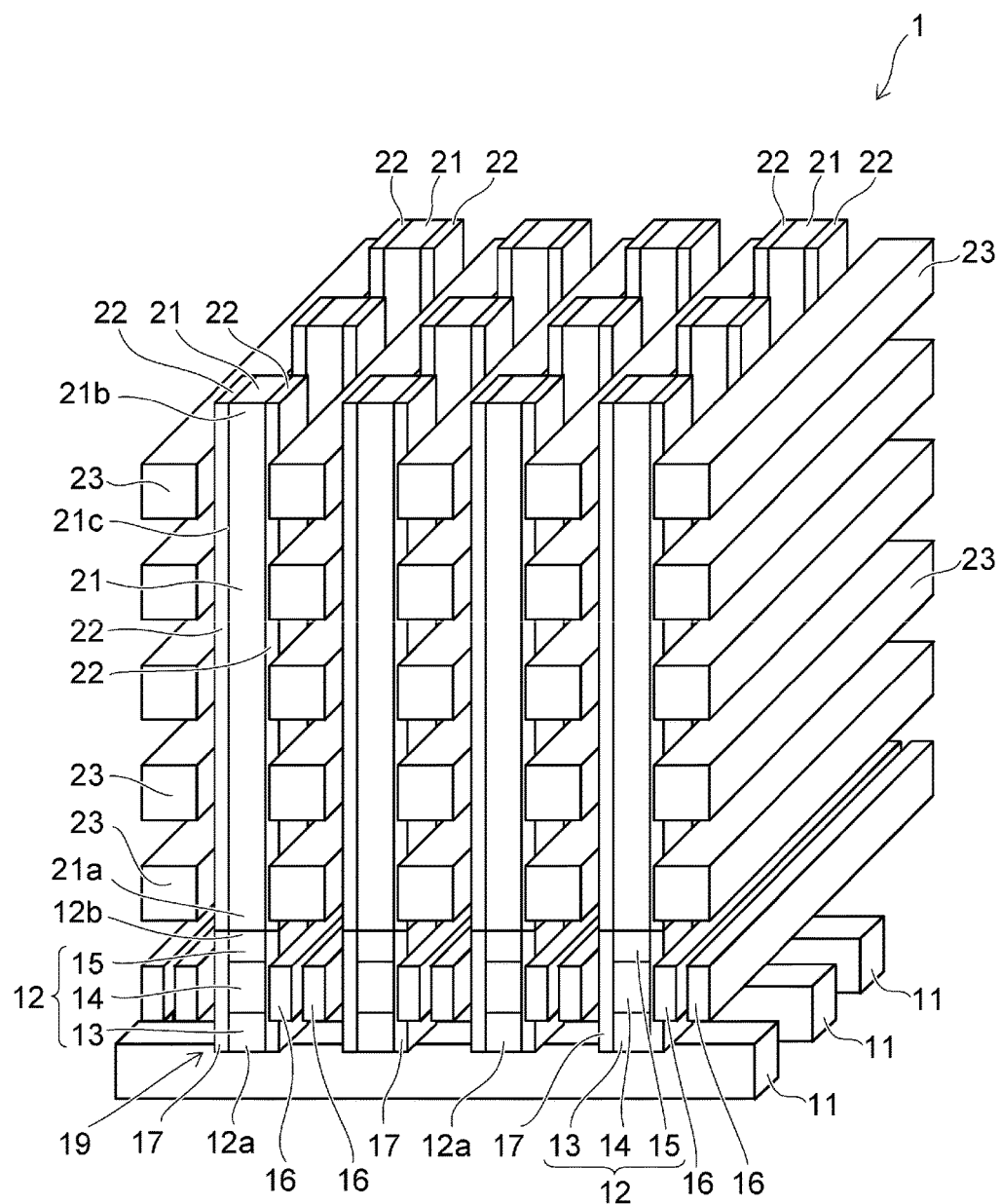
FIG. 1 is a perspective view illustrating one or more embodiments of a memory device according to a first aspect.

FIG. 1 is a perspective view illustrating one or more embodiment of a memory device according to the first aspect.

Figure 2:
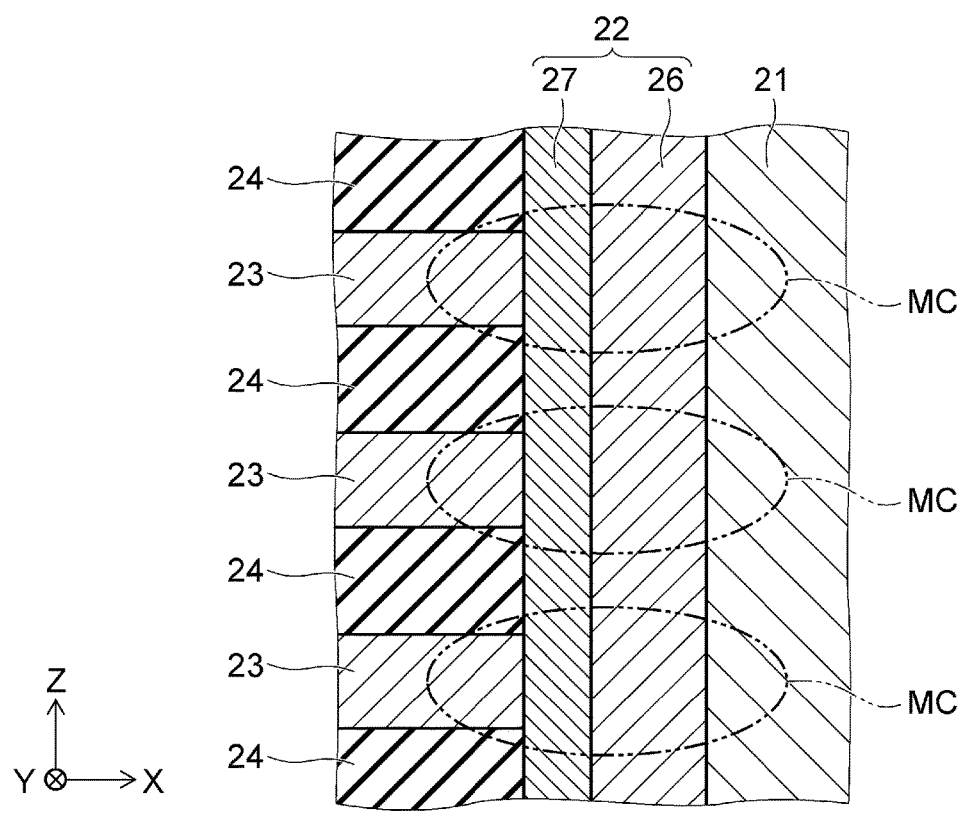
FIG. 2 is a cross-sectional view illustrating memory cells of one or more embodiments of the memory device according to the first aspect.

FIG. 2 is a cross-sectional view illustrating memory cells of one or more embodiments of the memory device according to the first aspect.

As shown in FIG. 1, one or more embodiments of the memory device 1 according to the first aspect includes a plurality of global bit lines 11. The global bit lines 11 are formed, for example, by partitioning an upper layer portion of, for example, a silicon substrate (not shown) by an element isolation insulator (not shown) or by providing an insulating film (not shown) on the silicon substrate and depositing polysilicon on the insulating film.

Hereinafter, an XYZ orthogonal coordinate system is adopted in the present specification, as shown in FIG. 1. The global bit lines 11 extend in referred to as an "X direction" and a direction in which the global bit lines 11 are arrayed is referred to as a "Y direction". In addition, a direction orthogonal to the X direction and the Y direction is referred to as a "Z direction." The "Z direction" can refer to a +Z direction (the direction of the Z arrow shown in FIG. 1) or to a −Z direction (directed opposite to the +Z direction). While the +Z direction is herein referred to as an "upward (direction)" and the −Z direction is herein referred to as a "downward (direction)", these expressions are used for the sake of convenience of explanation and do not indicate any relationship to a direction of gravity.

A plurality of silicon members 12 are provided on each global bit line 11. In a view from the Z direction, the silicon members 12 are arranged in a matrix configuration along the X direction and the Y direction. A shape of each silicon member 12 is a rectangular parallelepiped with the Z direction set as a longitudinal direction thereof. Lower ends 12a of the plurality of silicon members 12 arranged in a line along the X direction are commonly connected (electrically and/or physically) to one global bit line 11.

In each silicon member 12, from bottom up, that is, from a global bit line 11 side to the upward direction, an $n^+$ section 13, a $p^-$ section 14, and an $n^+$ section 15 are arranged along the Z direction in this order. It is noted that the relationship between the n-type sections and the p-type section may be reversed (that is, the n-type sections may be replaced by p-type sections and vice-versa).

Two gate electrodes 16 extending in the Y direction are provided between the silicon members 12 in the X direction. The gate electrodes 16 include, for example, polysilicon. In a view from the X direction, each gate electrode 16 overlaps an upper portion of the $n^+$ section 13, the $p^-$ section 14 (e.g. the entirety of the $p^-$ section 14), and a lower portion of the $n^+$ section 15.

A gate insulating film 17 including, for example, a silicon oxide, is provided between the silicon member 12 and the gate electrodes 16. The silicon member 12 including the n+ section 13, the p− section 14, and the n+ section 15, the gate insulating films 17, and a pair of gate electrodes 16 sandwiching the silicon member 12 therebetween constitute a thin-film transistor (TFT) 19 of, for example, an n-channel type. The TFT 19 is a switching device that switches over between conduction and cutoff of a current.

A local bit line 21 including, for example, titanium nitride (TiN) is provided on each silicon member 12. The local bit line 21 extends in the Z direction and a shape thereof is, for example, a quadrangular prism. A longitudinal direction of the local bit line 21 is the Z direction, and a length of the local bit line 21 in the Z direction is greater than a length thereof in the X direction, and is greater than a length thereof in the Y direction.

A lower end 21a of the local bit line 21 is connected (electrically and/or physically) to an upper end 12b of the corresponding silicon member 12. Since each local bit line 21 is disposed on a respective silicon member 12, a plurality of local bit lines 21 are arranged in a matrix configuration along the X direction and the Y direction in the memory device 1 as a whole.

A resistance change film 22 is provided on each of two side surfaces 21c of the local bit line 21 (e.g. a +X side surface and a −X side surface). The resistance change film 22 is a film having a resistance state that changes depending on a supplied voltage or current.

A plurality of word lines 23 extending in the Y direction are provided between local bit lines 21 adjacent to each other in the X direction, and are arranged to be isolated (electrically and/or physically) from one another in the Z direction. In a view from the Y direction, the word lines 23 are arranged in a matrix configuration along the X direction and the Z direction. The word lines 23 include, for example, titanium nitride. The resistance change film 22 is connected (electrically and/or physically) between one local bit line 21 and each of a plurality of word lines 23 arranged along the Z direction.

As shown in FIG. 2, a memory cell MC is configured at each intersecting portion between the local bit line 21 and each word line 23 via the resistance change film 22. The memory cells MC are arranged in a three-dimensional matrix configuration along the X direction, the Y direction, and the Z direction. In FIG. 2, for the sake of convenience of description, the resistance change film 22 is depicted somewhat thick, compared with the other components. The depicted thickness of the resistance change film 22 relative to the other components need not reflect an actual relative thickness.

An interlayer insulating film 24 including, for example, a silicon oxide (SiO) is provided in a space between the word lines 23 adjacent to each other in the Z direction. The word lines 23 and the interlayer insulating films 24 are thereby arranged alternately along the Z direction.

The resistance change film 22 includes a barrier layer 26 exhibiting nonlinear conductivity and a high conductivity layer (state maintenance layer) 27 including a conductive metal oxide, and is configured such that the barrier layer 26 and the high conductivity layer (state maintenance layer) 27 are stacked (e.g. along the X direction). The barrier layer 26 is disposed closer to the local bit line 21 than is the high conductivity layer 27, and the high conductivity layer 27 is disposed closer to the word lines 23 than is the local bit line 21. That is, the barrier layer 26 is disposed between the local bit line 21 and the high conductivity layer 27, and the high conductivity layer 27 is disposed between the barrier layer 26 and the word lines 23. In one or more embodiments according to the first aspect, the barrier layer 26 and the high conductivity layer 27 extend along the local bit line 21 in the Z direction, and are continuously provided between the plurality of word lines 23 arranged in the Z direction and the local bit line 21.

The barrier layer 26 includes a material having a relatively wide band gap and a low conductivity (compared to a material of the high conductivity layer 27, described below) such as, for example, one of amorphous silicon (aSi), a silicon nitride (SiN), an aluminum oxide (AlO), a silicon oxide, a hafnium oxide (HfO), and a zirconium oxide (ZrO), or a silicate or an aluminate thereof. Alternatively, the barrier layer 26 may be a stacked film in which two or more layers including these materials are stacked. The high conductivity layer 27 includes a material having a relatively narrow band gap and a high conductivity (compared to a material of the barrier layer 26) such as a titanium oxide (TiO), a tungsten oxide (WO) or a niobium oxide (NbO). In one or more embodiments, the band gap of the high conductivity layer 27 is narrower than the band gap of the barrier layer 26, and the conductivity of the high conductivity layer 27 is higher than the conductivity of the barrier layer 26. An oxygen deficiency is present in the high conductivity layer 27.

By applying a voltage to the resistance change film 22, oxygen ions are introduced from the barrier layer 26 into the high conductivity layer 27, a band structure of the resistance change film 22 changes and a resistance state thereof changes. A region R (see FIG. 3) where the resistance state changes most significantly in the resistance change film 22 is estimated to be located in the vicinity the barrier layer 26 in the high conductivity layer 27 (e.g. is a region adjacent to an interface between the barrier layer 26 and the high conductivity layer 27).

Some operations of one or more embodiments of the memory device 1 according to the first aspect will next be described.

Figure 3:
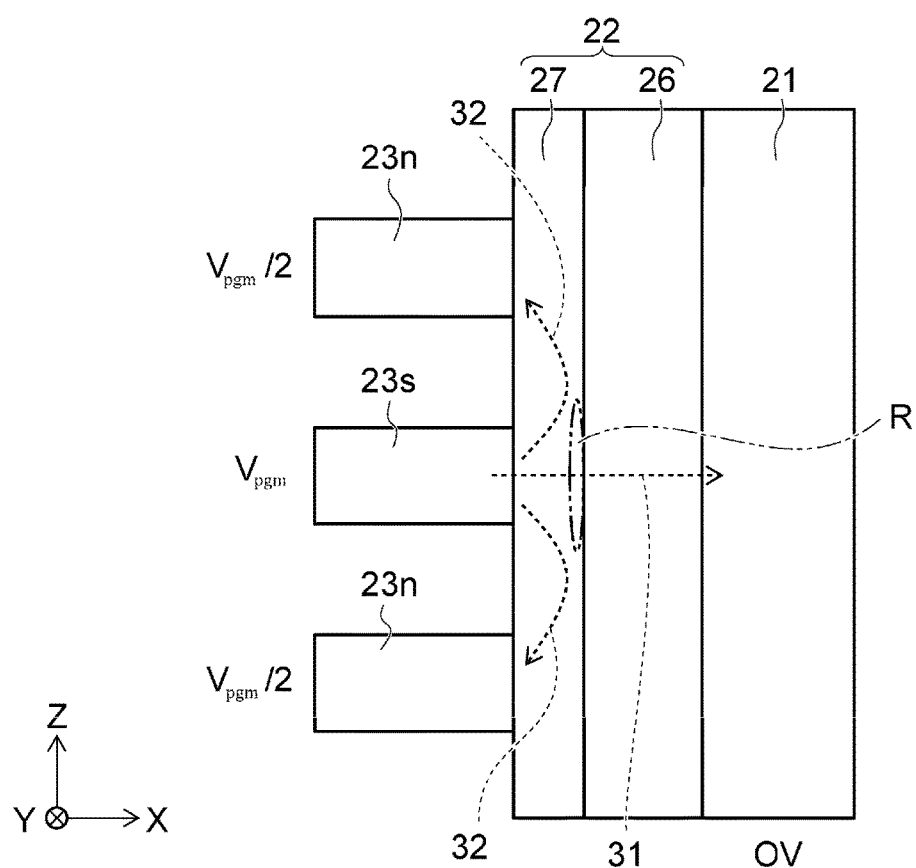
FIG. 3 illustrates operations of one or more embodiments of the memory device according to the first aspect.

FIG. 3 illustrates some operations of one or more embodiments of the memory device according to the first aspect.

As shown in FIG. 1 through FIG. 3, during a reset operation, a drive circuit (not shown) of the memory device 1 applies, for example, a ground potential (e.g. 0V) to a selected global bit line 11. Furthermore, the drive circuit applies an on-potential to a selected gate electrode 16 to set one TFT 19 in a conduction state. The ground potential (0V) is thereby applied to the selected local bit line 21 via the TFT 19. The drive circuit applies a positive write potential $V_{pgm}$ (a first voltage) to the selected word line 23 (hereinafter, also referred to as "selected word line 23s") and applies a potential ($V_{pgm}/2$) (a second voltage) to non-selected word lines 23 (hereinafter, also referred to as "non-selected word lines 23n"). The second voltage may have a magnitude equal to about half of the magnitude of the first voltage.

A voltage (equal to the first voltage minus the ground potential, or in the example described herein, $V_{pgm}$–0) is thereby applied between the selected word line 23s and the selected local bit line 21 to carry a cell actuating current 31 therebetween, as shown in FIG. 3. As a result, the resistance state of the region R of the high conductivity layer 27 located in the vicinity of the barrier layer 26 and located between the selected word line 23s and the selected local bit line 21 changes, and a resistance value of a portion of the resistance change film 22 disposed between the local bit line 21 and the selected word line 23s changes. On the other hand, since a smaller voltage (($V_{pgm}/2$)–0) is applied between each of the non-selected word lines 23n and the selected local bit line 21, a smaller current or substantially no current is carried therebetween.

At this time, since a voltage ($V_{pgm}-(V_{pgm}/2)$) is applied between the selected word line 23s and each of the non-selected word lines 23n, a leak current 32 is carried through the high conductivity layer 27 from the selected word line 23s toward the non-selected word lines 23n. However, the leak current 32 is carried through a portion closer to the word lines 23 in the high conductivity layer 27, and the region R where the resistance state changes is formed in the vicinity of the barrier layer 26. Owing to this, current paths of the leak current 32 are spaced apart from the region R and the leak current 32 has a reduced influence on the resistance state of the region R.

Some advantages of the present embodiment will next be described.

As described above, the barrier layer 26 is disposed closer to the local bit line 21 than is the high conductivity layer 27, and the high conductivity layer 27 is disposed closer to the word lines 23 than is the barrier layer 26 in the resistance change film 22 in the memory device 1, in one or more embodiments according to the first aspect. This provides for the current paths of the leak current 32 carried between the word lines 23 being isolated or distant from the region R, which is formed in the high conductivity layer 27 in a neighborhood of an interface with the barrier layer 26. The leak current 32, therefore, has a reduced influence on the resistance state of the region R. As a result, it is possible to suppress the leak current 32 generated with driving of a certain memory cell MC from changing the resistance states of the regions R of the adjacent memory cells MC, and to suppress data from being erroneously written to the adjacent memory cells MC (suppress disturbance). It is, therefore, possible to highly accurately and independently drive the memory cells MC in the memory device 1.

COMPARATIVE EXAMPLE

A comparative example will next be described.

Figure 4:
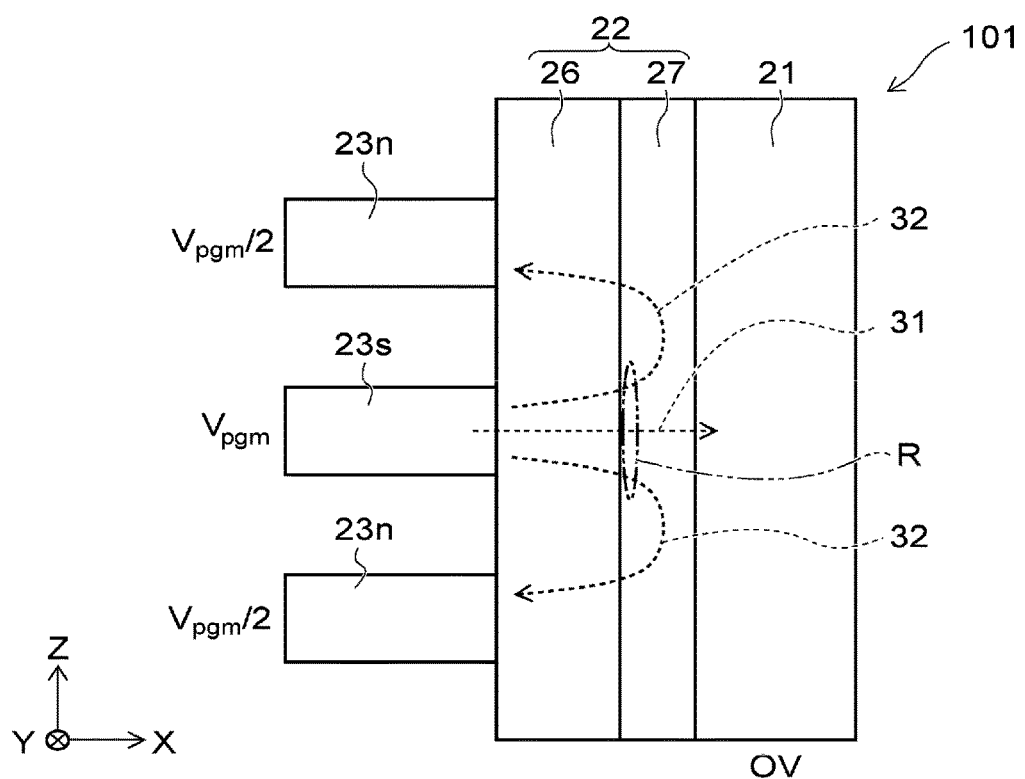
FIG. 4 is a cross-sectional view illustrating memory cells of a memory device according to a comparative example.

FIG. 4 is a cross-sectional view illustrating memory cells of a memory device according to the comparative example.

As shown in FIG. 4, a memory device 101 according to the comparative example is configured such that a disposition of the barrier layer 26 and the high conductivity layer 27 in the resistance change film 22 is a reversal of that according to the first aspect. That is, the barrier layer 26 is disposed closer to the word lines 23 than is the high conductivity layer 27, and the high conductivity layer 27 is disposed closer to the local bit line 21 than is the barrier layer 26.

In the memory device 101, the region R is formed in the vicinity of the barrier layer 26, that is, formed closer to the word lines 23 in the high conductivity layer 27 than is the case in embodiments according to the first aspect. Since the conductivity of the high conductivity layer 27 is higher than the conductivity of the barrier layer 26, much or most of the leak current 32 is carried through the high conductivity layer 27. Owing to this, paths of the leak current 32 are close to the region R and the resistance state of the region R is likely to be influenced by the leak current 32. Therefore, there is a possibility that the leak current 32 generated with driving of a certain memory cell changes the resistance states of the regions R in the other memory cells to cause erroneous writing.

(Second Aspect)

One or more embodiments according to a second aspect will next be described.

Figure 5:
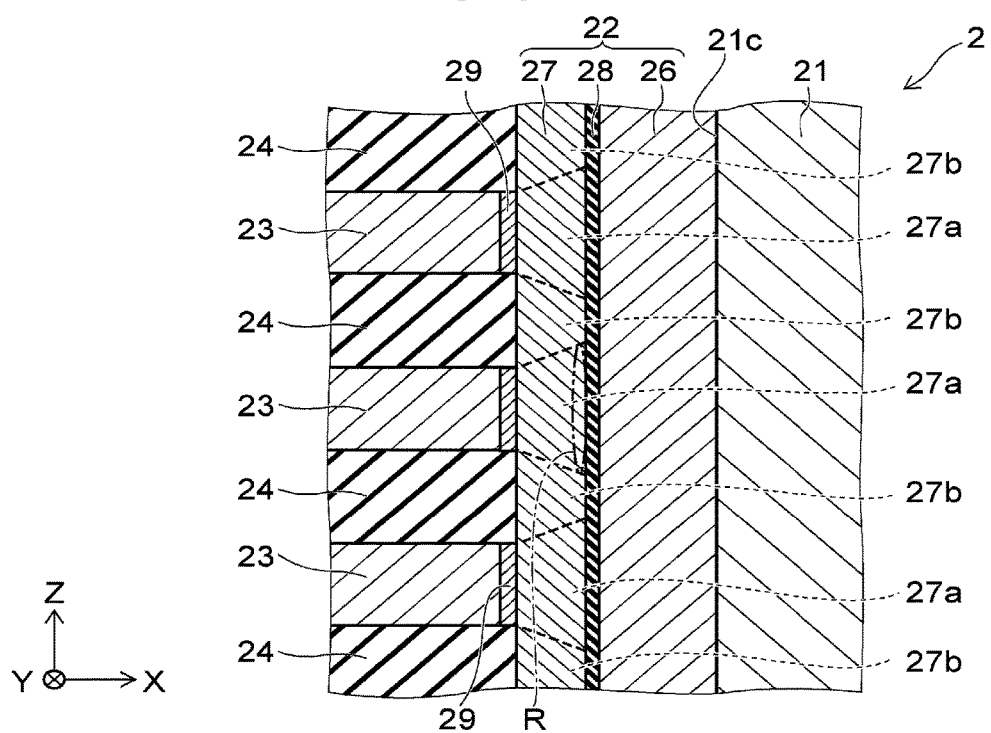
FIG. 5 is a cross-sectional view illustrating memory cells of one or more embodiments of a memory device according to a second aspect.

FIG. 5 is a cross-sectional view illustrating memory cells of one or more embodiments of a memory device according to the second aspect.

As shown in FIG. 5, a memory device 2 according to the second aspect is configured such that an interfacial layer 28 and metal oxide layers 29 are provided in addition to the configuration of the memory device 1 (see FIG. 2) according to the first aspect described above.

The interfacial layer 28 is provided between the barrier layer 26 and the high conductivity layer 27 in the resistance change film 22. A thickness of the interfacial layer 28, (a length thereof in the X direction) is smaller than a thickness of the barrier layer 26 and smaller than a thickness of the high conductivity layer 27. Furthermore, the interfacial layer 28 is an insulating layer, so that a resistivity of the interfacial layer 28 is higher than a resistivity of the barrier layer 26 and a resistivity of the high conductivity layer 27. The interfacial layer 28 is, for example, one of an aluminum oxide layer, a silicon oxide layer, and a silicon nitride layer, or a stacked film including one or more of those layers.

The metal oxide layer 29 is provided between the high conductivity layer 27 and each of the word lines 23. Therefore, a plurality of metal oxide layers 29 are arranged to be isolated from one another in the Z direction. The metal oxide layers 29 include a metal oxide of a metal included in the word lines 23.

For example, when the word lines 23 include titanium nitride, the metal oxide layers 29 include a titanium oxide. Furthermore, the high conductivity layer 27 includes the same material as is included in the metal oxide layers 29, and includes, for example, the titanium oxide. In one or more embodiments, the metal oxide layers 29 are each formed by oxidizing an end surface of the word line 23, and the high conductivity layer 27 is formed by depositing the titanium oxide.

As another example, when the word lines 23 include tungsten (W), then the metal oxide layers 29 include a tungsten oxide, and the high conductivity layer 27 also includes the tungsten oxide.

Crystallized sections 27a including a substantially crystallized metal oxide (e.g. an almost-completely crystallized metal oxide, such as a metal oxide that is about 99% crystallized or more, a metal oxide that is about 95% crystalized or more, a metal oxide that is about 90% crystalized or more, or a metal oxide that is about 80% crystalized or more) and amorphous substance-containing sections 27b including an amorphous metal oxide are provided in the high conductivity layer 27. A crystallinity of the crystallized sections 27a is higher than a crystallinity of the amorphous substance-containing sections 27b. The amorphous substance-containing sections 27b may be wholly amorphous, a mixture of amorphous and crystalline substances, or may include microcrystals beside the amorphous and crystalline substances. Each crystallized section 27a is crystallized with each metal oxide layer 29 as a starting point and adjoins the metal oxide layer 29. The amorphous substance-containing sections 27b are disposed between the crystallized sections 27a in the Z direction. In addition, the region R is formed in the vicinity of the interfacial layer 28 in each crystallized section 27a.

In one or more embodiments according to the second aspect, since each metal oxide layer 29 is formed on the end surface of each word line 23, the metal oxide deposited for forming the high conductivity layer 27 tends to be crystallized with the metal oxide layer 29 as a starting point. Alternatively or additionally, a current is carried between each local bit line 21 and the word lines 23 after producing the memory device 2, whereby Joule heat selectively crystallizes the high conductivity layers 27 and the crystallized sections 27a can thus be formed. It is thereby possible to promote crystallization of a portion where the region R is formed in each crystallized section 27a. Moreover, by providing the amorphous substance-containing sections 27b between the crystallized sections 27a, it is possible to suppress the current carried through the high conductivity layer 27 in the Z direction and the leak current 32 (see FIG. 3) between the word lines 23.

Furthermore, according to the second aspect, by providing the interfacial layer 28 between the barrier layer 26 and the high conductivity layer 27, it is possible to suppress a reaction between the barrier layer 26 and the high conductivity layer 27 when a current is carried to the resistance change film 22. For example, it is possible to suppress formation of a titanium silicide (TiSi) by the reaction between silicon (Si) included in the barrier layer 26 and titanium (Ti) included in the high conductivity layer 27. Reliability of the memory device 2 thereby improves. It is noted that in embodiments in which the interfacial layer 28 is sufficiently thin, the cell actuating current 31 (see FIG. 3) is carried by a tunneling effect at a time of driving the memory cell MC.

Some configurations, operations, and advantages of the second aspect other than those described above are similar to those of the aforementioned first aspect. It is noted that one of the interfacial layer 28 and the metal oxide layers 29 maybe provided. Similarly, it may also be possible to implement one of a multitude of described components for embodiments described below.

(Third Aspect)

A third aspect will next be described.

Figure 6:
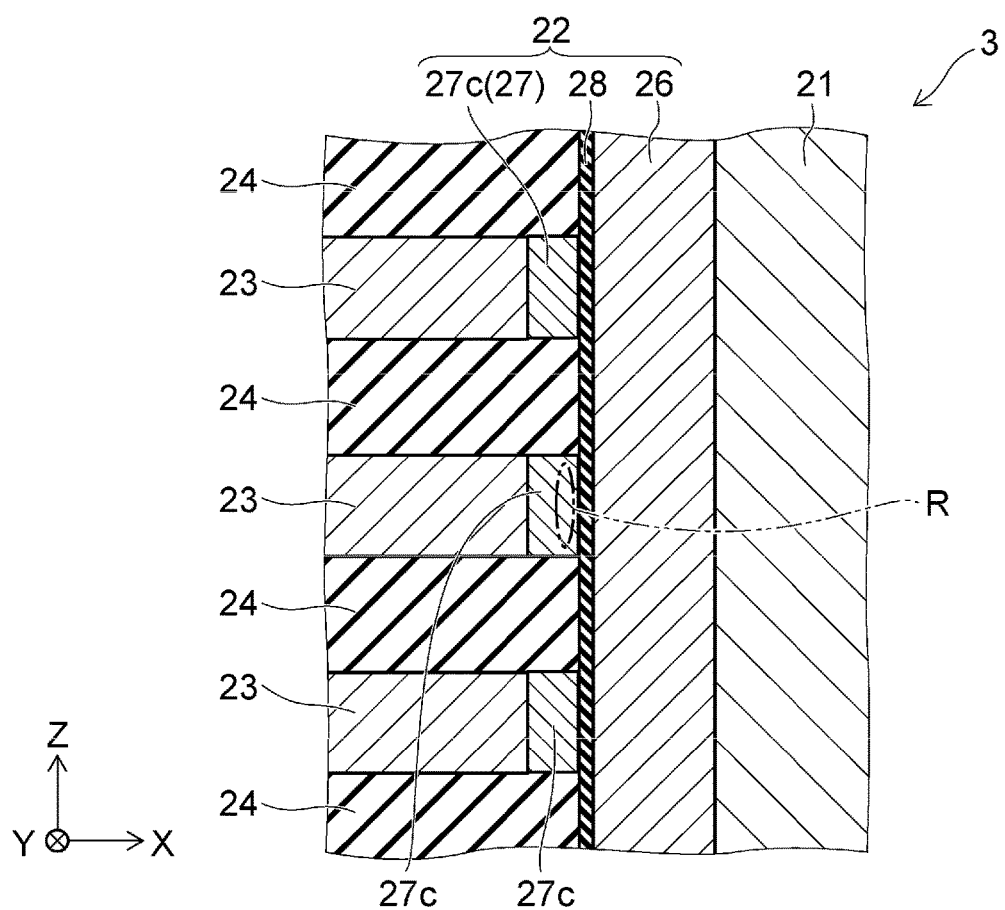
FIG. 6 is a cross-sectional view illustrating memory cells of one or more embodiments of a memory device according to a third aspect.

FIG. 6 is a cross-sectional view illustrating memory cells of one or more embodiments of a memory device according to the third aspect.

As shown in FIG. 6, a memory device 3 according to the third aspect differs from the memory device 1 (see FIG. 2) according to the first aspect described above in that the interfacial layer 28 extending in the Z direction is provided in the resistance change film 22 and in that the high conductivity layer 27 is split into a plurality of sections 27c along the Z direction. Each of the sections 27c of the high conductivity layer 27 is disposed between each word line 23 and the interfacial layer 28. Furthermore, the plurality of sections 27c adjoining one interfacial layer 28 are isolated from one another (e.g. do not connect through the interlayer insulating films 24). The region R is formed in the vicinity of the interfacial layer 28 in each section 27c.

According to the third aspect, since the high conductivity layer 27 is divided to correspond to the word lines 23, it is possible to prevent the leak current 32 (see FIG. 3) from being carried between the word lines 23. It is thereby possible to suppress disturbance between the memory cells more effectively and to suppress power consumption.

Some configurations, operations, and advantages of the third aspect other than those described above are similar to those of the aforementioned first aspect.

(Fourth Aspect)

A fourth aspect will next be described.

Figure 7:
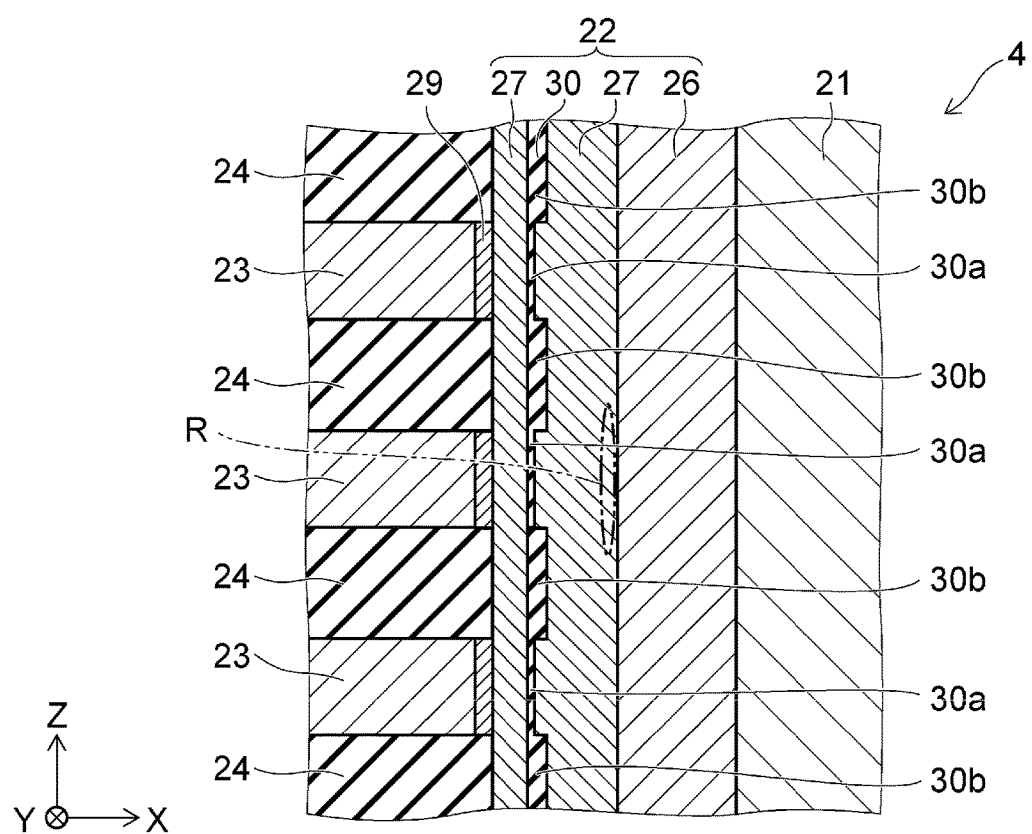
FIG. 7 is a cross-sectional view illustrating memory cells of one or more embodiments of a memory device according to a fourth aspect.

FIG. 7 is a cross-sectional view illustrating memory cells of one or more embodiments of a memory device according to the fourth aspect.

As shown in FIG. 7, a memory device 4 according to the fourth aspect differs from the memory device 1 (see FIG. 2) according to the first aspect described above in that the metal oxide layers 29 are provided and in that an insulating layer 30 is provided in the high conductivity layer 27. A configuration of the metal oxide layers 29 is the same as or similar to that described for the second aspect.

The insulating layer 30 is includes an insulating material and includes, for example, an aluminum oxide or a silicon nitride. Sections 30a and 30b are provided in the insulating layer 30 and arranged alternately along the Z direction. The sections 30a and 30b are formed integrally and constitute one insulating layer 30 as a whole. The sections 30a are each disposed between the barrier layer 26 and each word line 23, and the sections 30b are each disposed between the barrier layer 26 and each interlayer insulating film 24. The sections 30a are thinner than the sections 30b (e.g. thinner along the X direction). It is noted, however, that a thickness of the insulating layer 30 does not always change discontinuously on interfaces between the sections 30a and 30b as shown in FIG. 7, but may change continuously (e.g. a profile of the insulating layer 30 may define rounded bumps rather than steps as shown in FIG. 7).

The memory device 4 according to the fourth aspect can be manufactured, for example, as follows.

First, a lower structure that includes the global bit lines 11, the silicon members 12, the gate insulating films 17, and the gate electrodes 16 is provided. Next, the interlayer insulating films 24 and conductive films are alternately stacked, thereby forming a stacked body on the lower structure. Trenches extending in the Y direction are then formed in this stacked body, thereby splitting each conductive film into a plurality of word lines. The word lines exposed to inner surfaces of the trenches (the word lines 23) are oxidized, thereby forming the metal oxide layers 29.

Next, a titanium oxide, an aluminum oxide, and a titanium oxide are deposited in this order, thereby forming a portion of the high conductivity layer 27, the insulating layer 30, and a remainder of the high conductivity layer 27; amorphous silicon is deposited, thereby forming the barrier layer 26; and a titanium nitride is deposited, thereby forming a conductive film extending along a YZ plane. Next, the high conductivity layer 27, the insulating layer 30, the barrier layer 26, and the conductive film are divided along the Y direction, thereby splitting the conductive film into a plurality of local bit lines 21. A current is repeatedly carried between the local bit lines 21 and the word lines 23, thereby making sections present in the current paths in the insulating layer 30 thin. The sections made thin as described above are the sections 30a while other sections are the sections 30b.

According to the fourth aspect, the insulating layer 30 is provided in the high conductivity layer 27, thereby making it possible to suppress the leak current 32 (see FIG. 3) between the word lines 23. Moreover, by making the sections 30a thinner than the sections 30b in the insulating layer 30, it is possible to reduce the leak current 32 between the word lines 23 without greatly reducing the cell actuating current 31 carried between the word lines 23 and the local bit line 21.

Some configurations, operations, and advantages of the present embodiment other than those described above are similar to those of the aforementioned first aspect.

(Fifth Aspect)

A fifth aspect will next be described.

Figure 8:
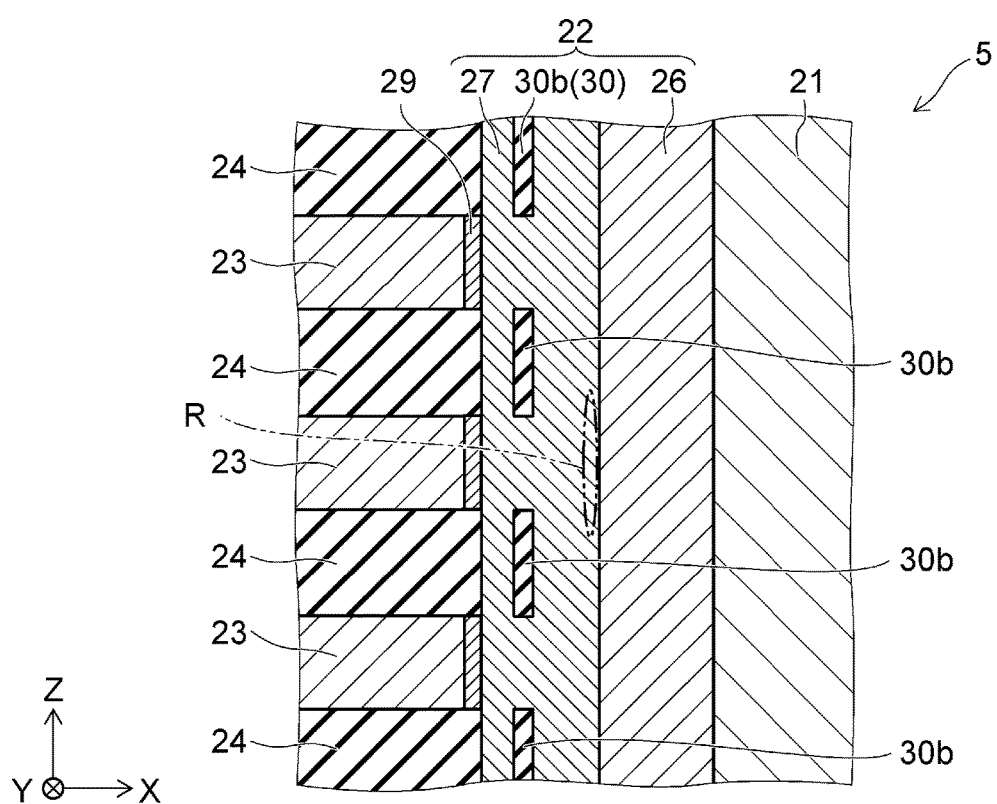
FIG. 8 is a cross-sectional view illustrating memory cells of one or more embodiments of a memory device according to a fifth aspect.

FIG. 8 is a cross-sectional view illustrating memory cells of one or more embodiments of a memory device according to the fifth aspect.

As shown in FIG. 8, a memory device 5 according to the fifth aspect differs from the memory device 4 (see FIG. 7) according to the fourth aspect described above in that the sections 30a of the insulating layer 30 are not provided and the sections 30b are provided. The sections 30b are arranged to be isolated from one another in the Z direction. For example, a current is carried between the local bit line 21 and the word lines 23 to eliminate the sections 30a in the fourth aspect, whereby it is possible to manufacture the memory device 5 according to the fifth aspect.

According to the fifth aspect, it is possible to reduce the leak current 32 between the word lines 23 without reducing the cell actuating current 31 carried between the word lines 23 and the local bit line 21.

Some configurations, manufacturing methods, operations, and advantages of the fifth aspect other than those described above are similar to those of the aforementioned fourth aspect.

According to the embodiments described so far, it is possible to realize the memory device capable of highly accurately and independently driving the memory cells.

As used herein, the terms "about" and "substantially" are used to describe and account for small variations. When used in conjunction with an event or circumstance, the terms "about" and "substantially" can refer to instances in which the event or circumstance occurs precisely as well as instances in which the event or circumstance occurs to a close approximation. For example, when used in conjunction with a numerical value, the terms "about" and "substantially" can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise. In the description of some embodiments, a component provided "on, " "above, " or "over" another component can encompass cases where the former component is directly on (e.g., in physical contact with) the latter component, as well as cases where one or more intervening components are located between the former component and the latter component.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure. Further, the aforementioned embodiments can be implemented by combination of the embodiments.

For example, in some of the embodiments, an example of providing the resistance change film 22 selectively on the side surface, which is oriented in the X direction, of each local bit line 21 has been illustrated. However, the present disclosure is not limited to that example and the resistance change film 22 maybe provided, for example, on the side surface, which is oriented in the Y direction, of each local bit line 21. In this case, the shape of the resistance change film 22 is a cylindrical shape surrounding the local bit line 21.

What is claimed is:

1. A memory device comprising:
   a first interconnection extending in a first direction;
   a plurality of second interconnections extending in a second direction intersecting the first direction; and
   a first resistance change film provided between the first interconnection and the plurality of second interconnections, wherein the first resistance change film comprises:
   a first conductive layer having a first conductivity;
   a second conductive layer provided between the first conductive layer and the plurality of second interconnections and having a second conductivity higher than the first conductivity;
   an insulating layer provided between the second conductive layer and the second interconnection; and
   a third conductive layer provided between the insulating layer and the plurality of second interconnections and having the second conductivity higher than first conductivity.

2. The memory device according to claim 1, wherein the second conductive layer and the third conductive layer comprise a crystallized metal oxide.

3. The memory device according to claim 2, wherein the second conductive layer and the third conductive layer comprise a crystallized titanium oxide or a crystallized tungsten oxide.

4. The memory device according to claim 1, wherein the insulating layer comprises a plurality of sections disposed between the respective plurality of second interconnections and the first conductive layer, and isolated from one another.

5. The memory device according to claim 1, wherein the second conductive layer and and the third conductive layer extend in the first direction and are continuously provided between the plurality of second interconnections and the first conductive layer.

6. The memory device according to claim 5, further comprising:
   a plurality of metal oxide layers provided between the respective plurality of second interconnections and the third conductive layer and comprising an oxide of a first metal, wherein:
   the second interconnection comprises the first metal, and
   the second conductive layer and the third conductive layer comprise the oxide of the first metal.

7. The memory device according to claim 6, wherein the third conductive layer comprises first sections and second sections, the first sections are disposed between the first conductive layer and the respective metal oxide layers and comprise a crystallized oxide of the first metal, and the second sections are disposed between the first sections in the third conductive layer and comprise an amorphous oxide of the first metal.

8. The memory device according to claim 7, wherein the first metal is titanium or tungsten.

9. The memory device according to claim 1, further comprising insulating films disposed between the second interconnections, and wherein
   the insulating layer comprising first sections disposed between the respective second interconnections and the first conductive layer, and second sections disposed between the insulating films and the first conductive layer, and
   a thickness of the first sections is smaller than a thickness of the second sections.

10. The memory device according to claim 1, further comprising a plurality of insulating films respectively disposed between the second interconnections, wherein the first resistance change film further comprises a plurality of insulating layers disposed between the insulating films and the first conductive layer, and isolated from one another.

* * * * *